(12) United States Patent
Lu

(10) Patent No.: US 7,229,932 B2
(45) Date of Patent: Jun. 12, 2007

(54) METHOD AND STRUCTURE FOR FABRICATING A HALFTONE MASK FOR THE MANUFACTURE OF SEMICONDUCTOR WAFERS

(75) Inventor: Cong Lu, Shanghai (CN)

(73) Assignee: Semiconductor Manufacturing International d (Shanghai) Corporation, Shanghai (CN)

( * ) Notice: Subject to any disclaimer, the term of this patent is extended or adjusted under 35 U.S.C. 154(b) by 46 days.

(21) Appl. No.: 10/773,519

(22) Filed: Feb. 6, 2004

(65) Prior Publication Data

US 2005/0142892 A1 Jun. 30, 2005

(30) Foreign Application Priority Data

Dec. 30, 2003 (CN) ............ 2003 1 0122965

(51) Int. Cl.
*H01L 21/31* (2006.01)
*H01L 21/469* (2006.01)
*H01L 21/8234* (2006.01)
*H01L 21/8244* (2006.01)
*H01L 21/00* (2006.01)

(52) U.S. Cl. ............ 438/778; 438/91; 438/29; 438/238

(58) Field of Classification Search ........ 438/778, 438/91, 26, 29, 22, 238, 98, 25
See application file for complete search history.

(56) References Cited

U.S. PATENT DOCUMENTS

| 5,474,864 A * | 12/1995 | Isao et al. .......... 430/5 |
| 5,674,647 A * | 10/1997 | Isao et al. .......... 430/5 |
| 2004/0086788 A1* | 5/2004 | Shiota et al. .......... 430/5 |

* cited by examiner

*Primary Examiner*—Chuong Anh Luu
(74) *Attorney, Agent, or Firm*—Townsend and Townsend and Crew LLP

(57) ABSTRACT

A method for manufacturing a mask for integrated circuit devices. The method includes providing a quartz substrate having a surface and forming a MoSi film overlying the surface of the quartz substrate. The method also includes patterning the MoSi film overlying the quartz substrate to form a mask pattern. A step of forming an opaque edge structure comprising a carbon bearing material on a portion of the surface around a peripheral region of the mask pattern is also included.

18 Claims, 3 Drawing Sheets

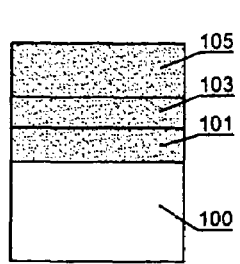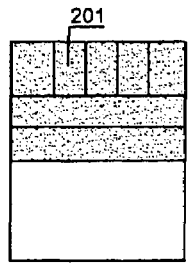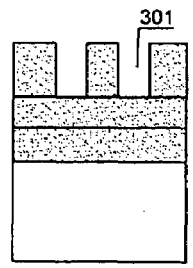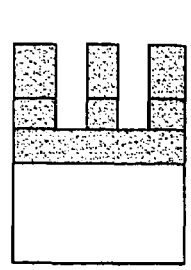
FIG. 1　　FIG. 2　　FIG. 3　　FIG. 4
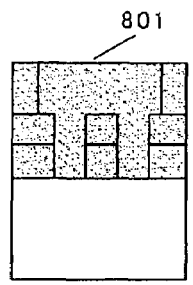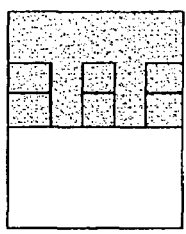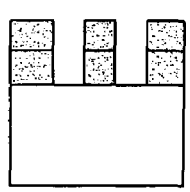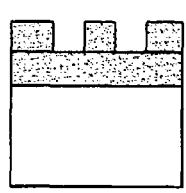
FIG. 8　　FIG. 7　　FIG. 6　　FIG. 5
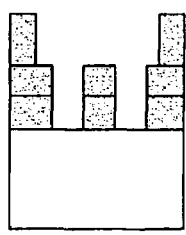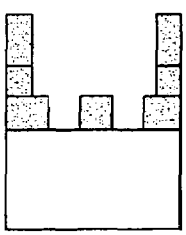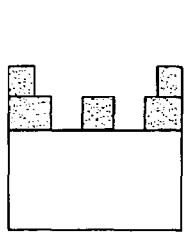
FIG. 9　　FIG. 10　　FIG. 11

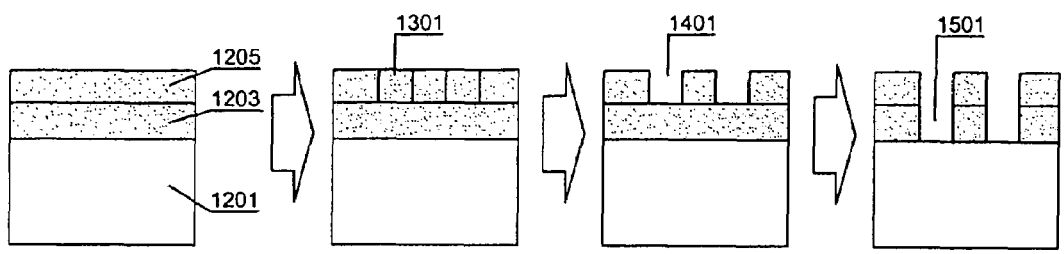
FIG. 12  FIG. 13  FIG. 14 1400  FIG. 15
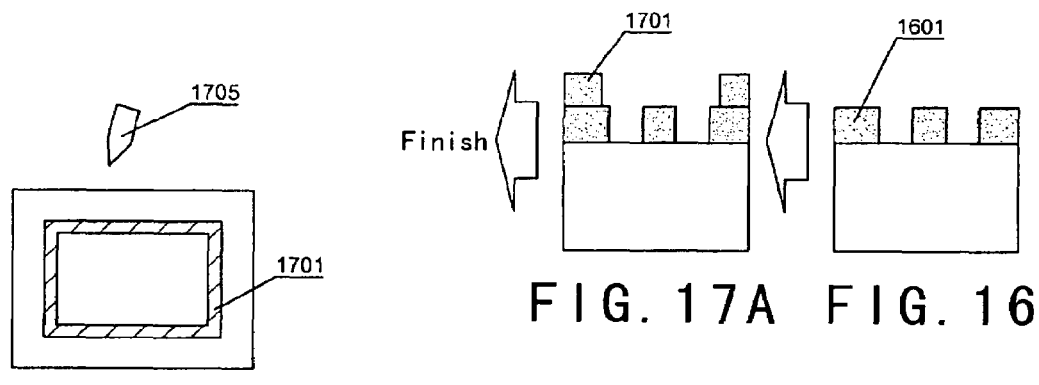
FIG. 17A  FIG. 16
FIG. 17B

METHOD AND STRUCTURE FOR FABRICATING A HALFTONE MASK FOR THE MANUFACTURE OF SEMICONDUCTOR WAFERS

CROSS-REFERENCES TO RELATED APPLICATIONS

NOT APPLICABLE

STATEMENT AS TO RIGHTS TO INVENTIONS MADE UNDER

FEDERALLY SPONSORED RESEARCH OR DEVELOPMENT NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to integrated circuits and their processing for the manufacture of semiconductor devices. More particularly, the invention provides a method for manufacturing a half tone phase shift mask for the manufacture of advanced integrated circuits such as dynamic random access memory devices, static random access memory devices (SRAM), application specific integrated circuit devices (ASIC), microprocessors and microcontrollers, Flash memory devices, and others.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed.

An example of such a limit is an ability to manufacture the masks that are used in performing lithography for the manufacture of integrated circuits. A commonly used mask is called a phase shift mask. Phase shift masks have been used to print feature sizes of less than 0.25 microns using interference patterns from illumination sources. Unfortunately, conventional processes to manufacture phase shift masks have become difficult to perform in an efficient and accurate manner. Additionally, conventional processes seem to be cumbersome and cause quality problems in the masks themselves. These and other limitations are described throughout the present specification and more particularly below.

From the above, it is seen that an improved technique for processing semiconductor devices is desired.

BRIEF SUMMARY OF THE INVENTION

According to the present invention, techniques for the manufacture of semiconductor devices are provided. More particularly, the invention provides a method for manufacturing a half tone phase shift mask for the manufacture of advanced integrated circuits such as dynamic random access memory devices, static random access memory devices (SRAM), application specific integrated circuit devices (ASIC), microprocessors and microcontrollers, Flash memory devices, and others.

In a specific embodiment, the invention provides a method for manufacturing a mask for integrated circuit devices. The method includes providing a quartz substrate having a surface and forming a MoSi film or other film (e.g., $Ta_xO_y$) overlying the surface of the quartz substrate. The method also includes patterning the MoSi film overlying the quartz substrate to form a mask pattern. A step of forming an opaque edge structure comprising a carbon bearing material on a portion of the surface around a peripheral region of the mask pattern is also included. Preferably, the opaque edge structure allows for transmission of 0–3 percent of light having a wave length of about 248 nm, 193 nm.

In an alternative specific embodiment, the invention provides a method for processing integrated circuit devices. The method includes providing a mask structure that has a quartz substrate having a surface, a patterned MoSi film overlying the surface of the quartz substrate to form a mask pattern, and an opaque edge structure comprising a carbon bearing material on a portion of the surface around a peripheral region of the mask pattern. The method also uses the mask structure for applying a pattern onto a photosensitive material overlying a semiconductor substrate.

In a further embodiment, the invention provides a half tone phase shift mask for integrated circuit devices. The mask includes a quartz substrate having a surface and a patterned MoSi film overlying the surface of the quartz substrate. An opaque edge structure comprising a carbon bearing material is on a portion of the surface around a peripheral region of the mask pattern.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention can be applied to a variety of applications such as memory, ASIC, microprocessor, and other devices. Preferably, the invention provides a way to manufacture a half tone phase shift mask using fewer steps, which result in a more efficient process. Other advantages of this invention may include 1. The process flow is considerably simplified and cycle time is shorten accordingly.
2. Critical dimension and defect control of main pattern becomes much easier.
3. The deposition system can be realized by modification on conventional Focussed Ion Beam ("FIB") or Laser Beam mask repair system, which costs less than traditional mask exposure system. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIGS. 1 through 11 are simplified cross-sectional view diagrams illustrating a conventional method of fabricating a half tone phase shift mask;

FIGS. 12–17 are simplified cross-sectional view diagrams illustrating a method of fabricating a mask according to an embodiment of the present invention;

FIG. 17A is a simplified top-view diagram of a deposition apparatus and mask structure according to an embodiment of the present invention.

DETAILED DESCRIPTION OF THE INVENTION

Figure 18:
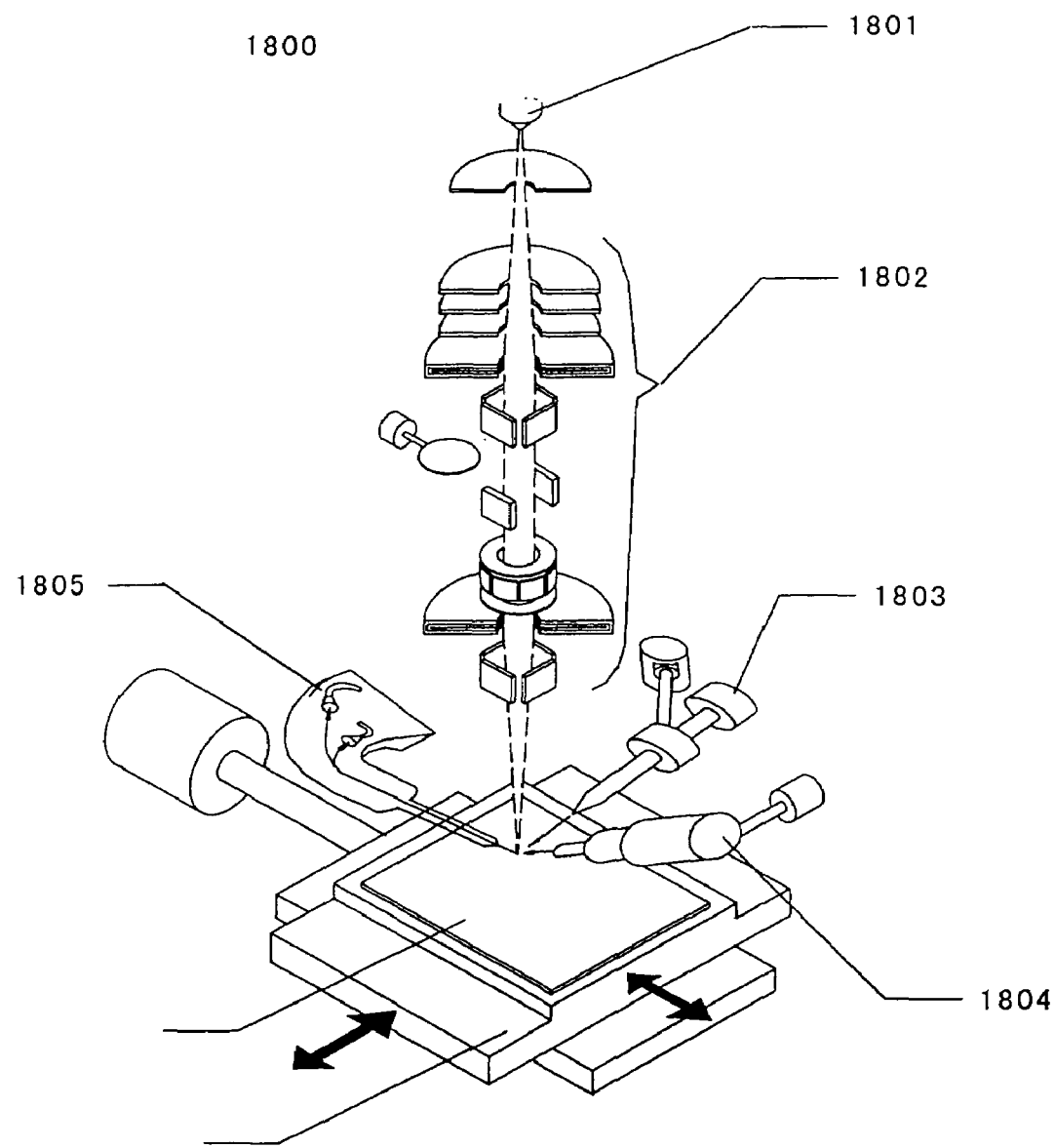
FIG. 18 is a simplified diagram of a deposition apparatus according to an embodiment of the present invention

According to the present invention, techniques for the manufacture of semiconductor devices are provided. More particularly, the invention provides a method for manufacturing a half tone phase shift mask for the manufacture of advanced integrated circuits such as dynamic random access memory devices, static random access memory devices (SRAM), application specific integrated circuit devices (ASIC), microprocessors and microcontrollers, Flash memory devices, and others.

A conventional method for fabricating a phase shift mask is provided as follows:

1. Provide a quartz substrate;
2. Form a MoSi film overlying the substrate;
3. Form an antireflective chromium (ArCr) film overlying the MoSi film;
4. Form a photoresist layer overlying the ArCr film;
5. Expose the photoresist layer;
6. Develop the photoresist layer to form openings for a mask pattern;
7. Wet etch ArCr film;
8. Strip the photoresist film;
9. Dry etch the MoSi film using the ArCr film as a mask to form mask structure;
10. Clean mask structure;
11. Form photoresist layer overlying the patterned mask structure;
12. Expose the photoresist layer to define edge structure;
13. Develop the photoresist layer to form an opening to protect the edge structure;
14. Wet etch the ArCr layer within the opening;
15. Strip the photoresist layer; and
16. Perform other steps, as desired The above sequence of steps is used to prepare a conventional half tone phase shift mask. As can be seen, there are at least two major photomasking steps. Many limitations exist with the conventional method. As an example, there are at least eleven major steps to manufacture the mask, which becomes expensive and time consuming. These and other limitations are described throughout the present specification and more particularly below.

FIGS. 1 through 11 are simplified cross-sectional view diagrams illustrating a conventional method of fabricating a half tone phase shift mask. As shown, the method provides a quartz substrate 100. The quartz substrate includes a MoSi film 101 overlying the substrate. The method forms an antireflective chromium (ArCr) film 103 overlying the MoSi film and a photoresist layer 105 is formed overlying the ArCr film. Referring to FIG. 2, the method exposes the photoresist layer 105. As shown, exposed regions 201 will be removed via development as illustrated in FIG. 3. Openings 301 are formed in the photoresist layer for a mask pattern.

The method then wet etches the ArCr film through the openings in the photoresist layer as shown in FIG. 4. Preferably, the wet etching uses a $CR_2C$. The method then strips the photoresist film as shown in FIG. 5. The method then etches the MoSi film using the ArCr film as a mask to form an intermediate mask structure, as illustrated by FIG. 6. Preferably, plasma etching is used. Such plasma etching uses a $Cl_2+O_2$ bearing species. The intermediate mask structure is cleaned.

A second masking and etching process is performed, as illustrated by FIG. 7. The method forms a photoresist layer overlying the patterned mask structure, as illustrated in FIG. 7. The method exposes 801 the photoresist layer to define edge structure. The photoresist is developed to form an opening to protect the edge structure, as shown in FIG. 9. A step of wet etching is performed on the ArCr layer within the opening to define the edge structure, as shown in FIG. 10. The photoresist layer is then stripped to expose the completed mask pattern including the edge structure, as illustrated in FIG. 11.

Numerous limitations exist with the conventional method of forming the phase shift mask. As merely an example, there are many steps to form the phase shift mask, which contributes to error in the completed pattern. Here, the wet etching process used to define the ArCr layer often leads to an undercut layer, which causes a large portion of the error in certain conventional processes. These and other limitations would become apparent to those of ordinary skill in the art. Techniques for overcoming certain limitations in the conventional method can be found throughout the present specification and more particularly below.

A method for fabricating a mask structure according to an embodiment of the present invention is outlined as follows:

1. Provide a quartz substrate;
2. Form a MoSi film overlying the substrate;
3. Form a photoresist layer overlying the MoSi film;
4. Expose the photoresist layer;
5. Develop the photoresist layer to form openings for a mask pattern;
6. Dry etch the MoSi film through the opening;
7. Strip the photoresist film;
8. Deposit carbon material on edges of the substrate to form an edge structure; and
9. Perform other steps, as desired.

The above sequence of steps provides a method for fabricating a photolithography mask according to an embodiment of the present invention. As shown, such steps include deposition of a carbon material on edges of the substrate to form the edge structure, which acts as a border for the mask pattern. The method has fewer steps and is therefore more efficient and cost effective. Further details of the present invention can be found throughout the present specification and more particularly according to the Figures described below.

FIGS. 12–17 are simplified cross-sectional view diagrams illustrating a method of fabricating a mask according to an embodiment of the present invention. These diagrams are merely an illustration, which should not unduly limit the scope of the claims herein. One of ordinary skill in the art would recognize many other variations, modifications, and alternatives. As shown, the method begins by providing a quartz substrate 1201. The quartz substrate is the preferred starting material, although other materials that exhibit similar light transmission characteristics may also be used. The substrate includes an overlying film of MoSi material 1203. Other materials such as $CrF_x$, $Ta_xO_y$, and $CrF_xO_y$ can also be used.

The quartz substrate includes the MoSi film 101 overlying the substrate. Other films of like characteristics such as $CrF_x$ can also be used. Preferably, deposition techniques such as sputtering, plating, or plasma deposition may be used to deposit the MoSi film. The method forms a photoresist layer 1205 is formed overlying the MoSi film. Referring to FIG. 13, the method exposes 1301 the photoresist layer 1205. As shown, exposed regions will be removed via development as illustrated in FIG. 14. Openings 1401 are formed in the photoresist layer for a mask pattern 1400.

The method then etches the MoSi film through the openings in the photoresist layer, as illustrated by FIG. 15. Preferably, dry etching techniques can be used. As merely an example, such dry etching techniques include, among others, plasma etching, reactive ion etching, ion coupling, and plasma etching. Plasma etching selectively removes 1501 the MoSi film without damaging the quartz substrate. The quartz substrates acts as an etch stop in the etching process of the MoSi film. The etched MoSi film is now patterned to form the mask pattern, which will be used in the manufacture of integrated circuits. Additionally, the MoSi film has been etched without wet processes and is substantially free from undercut regions. The method then strips the photoresist film as shown in FIG. 16. Stripping often occurs using ashers employing an oxygen bearing plasma, which can be mixed with water. Of course, the particular stripping technique depends upon other factors.

Preferably, the method forms a border 1701 along the periphery 1703 of the patterned mask region, as illustrated by FIG. 17. In a specific embodiment, the border is a deposited (carbon or chrome) material. The deposited carbon material is in a $C_{12}$, $C_{13}$, $C_{14}$ state. The deposited carbon material has a width of 4800 microns, a thickness of 50 nm~300 nm, and a length surrounding the periphery of the mask region. Depending upon the embodiment, certain techniques can be used to deposit the carbon material. As merely an example, the carbon material can be deposited using a focused ion beam ("FIB") tool 1705 (see FIG. 17A) such as the SIR 3000 manufactured by Seiko Instruments of Japan. Alternatively, laser deposition techniques provided by tools such as the Laser Beam Deposition System manufactured by NEC Corp. can also be used. The deposited carbon material has a transmittance ranging from about 0% to about 3%, which acts as a suitable border material. Preferably, the deposited carbon material is opaque, but may also be in a slightly different state and still be within the scope of the present invention. Further details of an apparatus can be found according to the figure and the description below.

FIG. 18 is a simplified diagram of a deposition apparatus 1800 according to an embodiment of the present invention. This diagram is merely an illustration, which should not unduly limit the scope of the claims herein. One of ordinary skill in the art would recognize many other variations, modifications, and alternatives. As shown, the deposition apparatus 1800 includes various features such as an ion source, optic sub-system, which is coupled to the source, a gas injection system, an electron gun, an ion detector, and other elements. The apparatus includes an x-y stage, which includes a mask (or work piece) that can be moved relative to the optic sub-system. Depending upon the embodiment, there can be other variations modifications, and alternatives.

Although the above has been illustrated according to a specific embodiment, there can be other modifications, alternatives, and variations. For example, boron has been used as an impurity, but other impurities such as Ga can also be used. It is also understood that the examples and embodiments described herein are for illustrative purposes only and that various modifications or changes in light thereof will be suggested to persons skilled in the art and are to be included within the spirit and purview of this application and scope of the appended claims.

A method for fabricating an integrated circuit device using the present mask structure according to an embodiment of the present invention is outlined as follows:

1. Provide a quartz substrate;
2. Form a MoSi film overlying the substrate;
3. Form a photoresist layer overlying the MoSi film;
4. Expose the photoresist layer;
5. Develop the photoresist layer to form openings for a mask pattern;
6. Dry etch the MoSi film through the opening;
7. Strip the photoresist film;
8. Deposit carbon material on edges of the substrate to form an edge structure;
9. Provide the completed patterned mask structure;
10. Use the mask structure for the manufacture of integrated circuts; and
11. Perform other steps, as desired.

The above sequence of steps provides a method for fabricating a photolithography mask according to an embodiment of the present invention. As shown, such steps include deposition of a carbon material on edges of the substrate to form the edge structure, which acts as a border for the mask pattern. The method has fewer steps and is therefore more efficient and cost effective. The method also includes using the completed mask for the manufacture of integrated circuits.

Although the above has been illustrated according to a specific embodiment, there can be other modifications, alternatives, and variations. For example, boron has been used as an impurity, but other impurities such as Ga can also be used. It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for manufacturing a mask for integrated circuit devices, the method comprising:

providing a quartz substrate having a surface, the quartz substrate comprising a thickness;

forming a MoSi film overlying the surface of the quartz substrate;

patterning the MoSi film overlying the quartz substrate to form a mask pattern; and forming an opaque edge structure comprising a carbon bearing material on a portion of the surface around a peripheral region of the mask pattern; whereupon the opaque edge structure has a light transmittance ranging from about 0% to about 3%.

2. The method of claim 1 wherein the forming of the opaque edge structure is provided by laser deposition.

3. The method of claim 1 wherein the forming of the opaque edge structure is provided by focused ion beam.

4. The method of claim 1 wherein the opaque edge structure occupies a region on the quartz substrate that is free from the mask pattern.

5. The method of claim 1 wherein the mask pattern is for a halftone phase shift mask.

6. The method of claim 1 further comprising cleaning the patterned MoSi film and opaque edge structure.

7. The method of claim 1 wherein the carbon is in a C12, C13, C14 state.

8. The method of claim 1 wherein the patterning of the MoSi film is a photolithography process.

9. The method of claim 8 wherein the patterning is the only photolithography process used by the method.

10. The method of claim 1 wherein the mask pattern is free from a chrome film.

11. A method for processing integrated circuit devices, the method comprising:

providing a mask structure, the mask structure comprising a quartz substrate having a surface, a patterned MoSi film overlying the surface of the quartz substrate to form a mask pattern, and an opaque edge structure comprising a carbon bearing material on a portion of the surface around a peripheral region of the mask pattern; and using the mask structure for applying a pattern onto a photosensitive material overlying a semiconductor substrate.

12. The method of claim 11 wherein the mask structure is a mask.

13. The method of claim 11 wherein the carbon bearing material is in a C12, C13, C14 state.

14. The method of claim 11 wherein the forming of the opaque edge structure is provided by laser deposition.

15. The method of claim 11 wherein the forming of the opaque edge structure is provided by focused ion beam.

16. The method of claim 11 wherein the opaque edge structure occupies a region on the quartz substrate that is free from the mask pattern.

17. The method of claim 11 wherein the mask pattern is for a halftone phase shift mask.

18. The method of claim 11 further comprising cleaning the patterned MoSi film and opaque edge structure.

* * * * *